(12) United States Patent
Li

(10) Patent No.: US 6,680,158 B2
(45) Date of Patent: Jan. 20, 2004

(54) RADIATION-SENSITIVE RESIN COMPOSITION FOR SPACER

(75) Inventor: Chun-Hsien Li, Taichung (TW)

(73) Assignee: Chi Mei Corporation, Tainan (TW)

( * ) Notice: Subject to any disclaimer, the term of this patent is extended or adjusted under 35 U.S.C. 154(b) by 179 days.

(21) Appl. No.: 09/917,699

(22) Filed: Jul. 31, 2001

(65) Prior Publication Data

US 2003/0036018 A1 Feb. 20, 2003

(51) Int. Cl.[7] .............................................. G03F 7/004
(52) U.S. Cl. ............................ 430/270.1; 430/280.1; 430/281.1; 430/283.1
(58) Field of Search ....................... 430/270.1, 280.1, 430/283.1, 281.1

(56) References Cited

U.S. PATENT DOCUMENTS

| | | | | |
|---|---|---|---|---|
| 5,530,036 A | * | 6/1996 | Sano et al. ................... | 522/79 |
| 5,677,385 A | * | 10/1997 | Miyake et al. .............. | 525/286 |
| 5,731,128 A | * | 3/1998 | Kanda et al. ............. | 430/281.1 |
| 6,127,091 A | * | 10/2000 | Geissler et al. .......... | 430/271.1 |
| 6,191,184 B1 | * | 2/2001 | Suzuki et al. ................. | 522/79 |
| 6,432,614 B1 | * | 8/2002 | Ueda et al. ............... | 430/281.1 |
| 6,451,878 B1 | * | 9/2002 | Fukuzawa et al. .......... | 523/451 |

* cited by examiner

*Primary Examiner*—Janet Baxter
*Assistant Examiner*—Amanda C. Walke

(57) ABSTRACT

The present invention relates to a radiation-sensitive resin composition for spacer is a copolymer comprising derivative units, an addition polymerizable monomer having at least one ethylenically unsaturated double bond, radiation-sensitive initiator and solvent, wherein said copolymer comprising (a1) 5 wt %–50 wt % of unsaturated carboxylic acid monomer derivative unit; (a2) 10 wt %–70 wt % of epoxy-containing unsaturated monomer derivative unit; and (a3) 0 wt %–70 wt % of copolymerizable unsaturated monomer derivative unit other than the above monomer derivative units (a1) and (a2). The content of said copolymer [A] which has a molecular weight of 800–7,000 and which has a molecular weight of greater than 70,000 are determined to account for 10 wt %–23 wt % and less than 5 wt %, respectively, based on the total weight of said copolymer[A].

4 Claims, No Drawings

RADIATION-SENSITIVE RESIN COMPOSITION FOR SPACER

BACKGROUND OF THE INVENTION

1. Field of the Invention

The present invention relates to a radiation-sensitive resin composition for spacer used in liquid crystal display (LCD) or touch panel, and more particularly to a radiation-sensitive resin composition for spacer, which resin composition provides good aging stability, and good spacer properties such as good surface smoothness or no undercut, good heat resistance and good chemical resistance and which resin composition can be developed by alkaline developer solution.

2. Description of the Related Art

It has been known that glass bead spacers or plastic bead spacers are often used to distribute in-between the two pieces of glass to maintain a given cell gap of LCD. Due to the random dispersion manner, the beads distributed by this known way are often spread on the red (R), green (G) and blue (B) pixel elements, leading to a scattering effect of the incident light, which in turn resulting in a decreasing contrast of the LCD.

In view of the problem of the decreasing contrast of LCD caused by the light scattering effect in the prior art, one of the major objects of the present invention is to provide a method to prepare spacers made from radiation-sensitive resin composition by photolithography. After development, the radiation-sensitive resin spacers prepared according to the present invention form dot type or stripe type spacers on the substrate (glass) plate and spread in the area beyond the R, G, and B pixel elements, therefore the problem of decreasing contrast caused by the light scattering can be dissolved. Furthermore, the spacers prepared according to the present invention provide good controllability of spacer thickness, good controllability for the cell gap between the two pieces of glass, and significantly improved LCD precision, all of which have extreme importance to the high resolution LCD.

In the manufacture process of LCD, there are three ways for the formation of radiation-sensitive resin spacers and alignment layer as follows:

1. coating the alignment layer after the formation of the radiation-sensitive resin spacers, then rubbing;
2. coating the alignment layer and rubbing, then forming the radiation-sensitive resin spacers; and
3. coating the alignment layer followed by forming the radiation-sensitive resin spacers, then finally rubbing.

In the above methods 1 and 3, rubbing comes after the formation of the radiation-sensitive resin spacers, which often leads to the rub-off of the spacers thus resulting in a poor display quality. In the method 2, because the alignment layer coating is performed prior to the formation of the spacers, swelling and dissolution of the alignment layer and scum deposition on the alignment layer occur, which cause abnormal alignment of the liquid crystals. The problems of poor surface smoothness, high undercut, poor heat and poor chemical resistance of the spacers, which were usually occurred in prior art, caused deformation of spacer and poor display quality of LCD. On the other hand, the viscosity of radiation-sensitive resin composition is apt to increase with increasing storage time, which resulted in production problems.

SUMMARY OF THE INVENTION

The object of the present invention is to avoid the poor display quality problem of the LCD mentioned above, the further object of the present invention is to provide a radiation-sensitive resin composition with good aging stability and to provide improved surface smoothness, heat resistance, chemical resistance and decreasing or no undercut for the radiation-sensitive resin spacers.

For the above-described objects, the radiation-sensitive resin composition for LCD spacers according to the present invention is such a radiation-sensitive resin composition for spacers, which is provided to meet the above-mentioned requirements and can be developed by alkaline developer solutions.

BRIEF DESCRIPTION OF THE TABLES

The preferred embodiments according the present invention will be set forth in details thereinafter in illustration with the aid of the following figures and tables, wherein:

Table 1 shows the synthesis examples of copolymer [A] and their molecular weight distribution in the embodiments;

Table 2 shows formulations in Examples 1–5 and Comparative Examples 1–8 and the contents of residual unsaturated carboxylic acid monomer; and Table 3 shows the evaluation results for the spacers made from the radiation-sensitive resin compositions obtained in Examples 1–5 and Comparative Examples 1–8 of the embodiments according to the present invention.

DETAILED DESCRIPTION OF THE INVENTION

The radiation-sensitive resin composition for LCD spacers according to the present invention comprises of [A], a copolymer comprising (a1) unsaturated carboxylic acid monomer derivative unit, (a2) epoxy-containing unsaturated monomer derivative unit, and optionally (a3) copolymerizable unsaturated monomer derivative unit other than the above monomer derivative units (a1) and (a2); [B] an addition polymerizable compound having at least one ethylenically unsaturated double bond; [C] a radiation-sensitive initiator; and [D] a solvent.

The compositions of the present invention will be described in details thereafter.

[A] Units of the Copolymer [A]

The copolymer [A] according to the present invention is obtained by free radical polymerization reaction of (a1) unsaturated carboxylic acid monomer, (a2) epoxy-containing unsaturated monomer, and (a3) optionally, copolymerizable unsaturated monomer other than the above monomer (a1) and (a2) in the presence of a solvent and an initiator, wherein:

The content of the unsaturated carboxylic acid monomer derivative unit (a1) is in the range of 5 wt %–50 wt %, preferably in the range of 15 wt %–40 wt %. When it is less than 5 wt %, the solubility of the obtained radiation sensitive resin composition in an alkali developer solution is liable to lower which results in poor developing property. On the other hand, when it is more than 56 wt %, the solubility of which becomes too high, and the developing property is poor. The unsaturated carboxylic acid monomer for (a1) can be exemplified as follows: unsaturated monocarboxylic acid monomers, such as acrylic acid, methacrylic acid, crotonic acid, α-chloroacrylic acid, ethylacrylic acid and cinnamic acid; unsaturated dicarboxylic acid(anhydrides) monomers, such as maleic acid, maleic anhydride, fumaric acid, itaconic acid, itaconic anhydride, citraconic acid, citraconic anhydride, and mesaconic acid and anhydrides thereof; and unsaturated polycarboxylic acid(anhydrides) having a valence of 3 or more. Among these, acrylic acid and methacrylic acid are preferred. The unsaturated carboxylic acid monomers can be used alone or in admixture of two or more.

The content of the epoxy-containing unsaturated monomer derivative unit (a2) is in the range of 10 wt %–70 wt %;

preferably in the range of 20 wt %–50 wt %. When it is less than 10 wt %, the heat resistance and chemical resistance of the radiation sensitive resin composition are poor; when it is more than 70 wt %, the solubility of the obtained radiation sensitive resin composition in an alkali developer solution is liable to lower and the developing property is poor. The epoxy-containing unsaturated monomer for (a2) can be exemplified as follows: glycidyl acrylate, glycidyl methacrylate, glycidyl α-ethylacrylate, 3,4-epoxybutyl acrylate, 6,7-epoxyheptyl methacrylate, 6,7-epoxyheptyl α-ethylacrylate, o-vinylbenzylglycidylether, m-vinylbenzylglycidylether, p-vinylbenzylglycidylether; among these, glycidyl methacrylate, 6,7-epoxyheptyl methacrylate, o-vinylbenzylglycidylether, m-vinylbenzylglycidylether and p-vinylbenzylglycidylether are preferred. The epoxy-containing unsaturated monomers can be used alone or in admixture of two or more.

The content of the copolymerizable unsaturated monomer derivative unit (a3) is in the range of 0 wt %–70 wt %, preferably in the range of 10 wt %–60 wt %, more preferably 15 wt %–50 wt %. When it is more than 70 wt %, the solubility of the obtained radiation sensitive resin composition in an alkali developer solution is liable to lower. Examples of the copolymerizable unsaturated monomers (a3) are typically alkyl methacrylates such as methyl methacrylate, ethyl methacrylate, n-butyl methacrylate, sec-butyl methacrylate, t-butyl methacrylate, and the like; alkyl acrylates such as methyl acrylate, isopropyl acrylate, and the like; cyclic alkyl methacrylats such as cyclohexyl methacrylate, 2-methylcyclohexyl methacrylate, dicyclopentanyl methacrylate, dicyclopentyloxyethyl methacrylate, isobornyl methacrylate, and the like; cyclic alkyl acrylates such as cyclohexyl acrylate, 2-methyl cyclohexyl acrylate, dicyclopentanyl acylate, dicyclopentanyloxyethyl acrylate, and the like; dicarboxylates such as diethyl maleate, diethyl fumarate, diethyl itaconate and the like; hydroxy alkyl methacrylates such as 2-hydroxyethyl methacrylate, 2-hydroxypropyl methacrylate, and the like; or styrene, α-methyl styrene, m-methyl styrene, p-methyl styrene, p-methoxy styrene, and the like. Among these, styrene, t-butyl methacrylate, dicyclopentyl methacrylate, dicyco-pentanyloxyethyl acrylate, p-methoxy styrene are preferred. These monomers can be used alone or in admixture of two or more.

Examples of the solvents used for copolymer [A] are benzene, toluene, xylene, methanol, ethanol, ethylene glycol monopropyl ether, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, methyl ethyl ketone and acetone. Among these, diethylene glycol dimethyl ether and propylene glycol methyl ether acetate are preferred. These solvents can be used alone or in admixture of two or more.

Examples of initiators used for preparing copolymer [A] are free radical polymerization initiators can be exemplified as follows: azo-compounds such as 2,2'-azobisisobutyronitrile, 2,2'-azobis-(2,4-dimethylvaleronitrile), 2,2'-azobis-(4-methoxy-2,4-dimethylvaleronitrile), and 2,2'-azobis-2-methyl butyronitrile, and the like; peroxides such as benzoyl peroxide, and the like.

The molecular weight distribution of copolymer [A] according to the present invention is analyzed by gel permeation chromatography (GPC). The total integral area of the intensity of copolymer [A] between Mw of 800–2,000,000 is taken as 100 wt %. The content of the copolymer [A] which has a molecular weight of 800–7,000 is determined to account for 10 wt %–23 wt %, preferably 13 wt %–20 wt % according to the present invention, based on said 100 wt % of total integral area of the intensity of copolymer [A]. When the content of the copolymer [A] which has a molecular weight of 800–7,000 is less than 10 wt %, the aging stability of the resin composition is worse and when it is mote than 23%, the heat and chemical resistance are poor. On the other hand, the content of copolymer [A] which has a molecular weight of greater than 70,000 is determined to account less than 5 wt %, preferably less than 3 wt %, based on said 100 wt % of total integral area of the intensity of copolymer [A]. When the content of copolymer [A] has a molecular weight of greater than 70,000 is more than 5 wt %, the aging stability and the developing property of the radiation-sensitive resin composition are poor.

[B]: An Addition Polymerizable Compound Having at Least one Ethylenically Unsaturated Double Bonds and [C]: the Radiation-Sensitive Initiators Photolithography is a process containing chain reactions of polymerization which are initiated by radiation-sensitive initiators of free radicals type. The main drawback of photoresist of free radical type is that they are susceptible to oxygen causing the termination of the polymerization reaction, and thus the sensitivity of photoresist is decreased. It has been known that improvement can be made by coating an oxygen impermeable film upon the photoresist film to prevent the oxygen drawback. Alternatively, radiation-sensitive resin compositions having good sensitivity without oxygen drawbacks, good developing property and less scum deposition can also be obtained by selecting suitable polymerizable monomers and radiation-sensitive initiators or selecting a suitable ratio of the polymerizable monomer and radiation-sensitive initiator to the radiation-sensitive resin composition.

The polymerizable compound [B] in the present invention is a monomer having at least one ethylenically unsaturated double bonds. For the polymerizable compound [B] having one ethylenically unsaturated double bond such as acrylamide, (meth)acryloylmorpholine, 7-amino-3,7-dimethyloctyl (meth)acrylate, isobutoxymethyl (meth) acrylamide, isobornyloxyethyl (meth)acrylate, isobornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth) acrylate, dodecyl (meth)acrylate, dicyclopentenyloxyethyl (meth)acrylate, dicyclopentenyl (meth)acrylate, N,N-dimethyl (meth)acrylamide, tetrachlorophenyl (meth) acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinylcaprolactam, N-vinylpyrrolidinone, phenoxyethyl (meth)acrylate, pentachlorophenyl (meth)acrylate, pentabromophenyl (meth)acrylate, polyethylene glycol mono(meth)acrylate, polypropylene glycol mono(meth) acrylate and bornyl (meth)acrylate.

The polymerizable compound [B] having two or more ethylenically unsaturated double bonds such as ethylene glycol di(meth)acrylate, dicyclopentenyl di(meth)acrylate, triethylene glycol diacrylate, tetraethylene glycol di(meth) acrylate, tris(2-hydroxyethyl) isocyanate di(meth)acrylate, tris(2-hydroxyethyl) isocyanante tri(meth)acrylate, caprolactone-modified tris(2-hydroxyethyl) isocyanante tri (meth)acrylate, trimethylolpropane tri(meth)acrylate, ethyleneoxide (hereinafter abbreviated as EO) modified trimethylolpropane tri(meth)acrylate, propyleneoxide (hereinafter abbreviated as PO) modified trimethylolpropane tri(meth) acrylate, tripropylene glycol di(meth)acrylate, neopentyl glycol di(meth)acrylte, 1,4-butanediol di(meth)acrylate, 1,6- hexadiol di(meth)acrylate, pentaerythritol tri(meth)acrylate, pentaerythritol tetra(meth)acrylate, polyesterdi(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO modified bisphenol F di(meth)acrylate, phenol novolac polyglycidyl ether (meth)acrylate, and the like.

Among these, trimethylolpropane triacrylate, EO-modified trimethylolpropane triacrylate, PO-modified trimethylolpropane triacrylate, pentaerythritol triacrylate, pentaerythritol tetraacrylate, dipentaerythritol hexaacrylate, dipentaerythritol pentaacrylate, dipentaerythritol tetaacrylate, caprolactone-modified dipentaerythritol hexaacrylate, caprolactone-modified dipentaerythritol pentaacrylate, and ditrimethylolpropane tetraacrylate are preferred.

The amount of compound [B] used in the present invention is generally 5–220 parts by weight, preferably is 50–140 parts by weight, based on 100 parts by weight of copolymer [A].

Examples of the radiation-sensitive initiators [C] used in the present invention can be selected from acetophenone series compounds such as p-dimethylaminoacetophenone, α,α'-dimethoxyazoxyacetophenone, 2,2'-dimethyl-2-phenylacetophenone, p-methoxy-acetophenone, 2-methyl-[4-(methylthio)phenol, 2-morpholino-1-propanone, 2-benzyl-2-N, N-dimethylamino-1-(4-morpholinophenyl)-1-butanone; and from biimidazole series compounds such as 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methoxyphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4'5,5'-tetraphenylbiimidazole, 2,2'-bis(2-chlorophenyl)-4,4'5,5'-tetraphenylbiimidazole, and the like. Among these, a combined radiation-sensitive initiator of 2-benzyl-2-N, N-dimethylamino-1-(4-morpholinophenyl)-1-butanone and 2,2'-bis(2-chlorophenyl)4,4'5,5'-tetraphenylbiimidazole is preferred.

The radiation-sensitive resin composition of the present invention also can comprise benzophenone series compounds as the radiation-sensitive initiators such as thioxanthone, 2,4-diethylthioxanthone, thioxanthone-4-sulfone, benzophenone, 4,4'-bis(dimethylamino)benzophenone, 4,4'-bis(diethylamino)benzophenone, and the like; examples of the other radiation-sensitive initiator include α-diketone series compounds such as benzil, acetyl, and the like; acyloin series compounds such as benzoin, and the like; acyloin ether series compounds such as benzoin methyl ether, benzoin ethyl ether, benzoin isopropyl ether, and the like; acylphosphineoxide series compounds such as 2,4,6-trimethylbenzoyl diphenylphosphineoxide, bis-(2,6-dimethoxy-benzoyl)-2,4,4-trimethyl benzylphosphineoxide, and the like; quinone series compounds such as anthraquinone, 1,4-naphthoquinone, and the like; halide compounds such as phenacyl chloride, tribromomethyl phenylsulfone, tris(trichloromethyl)-s-triazine, and the like; peroxide such as di-tert-butyl peroxide, and the like. Among these, benzophenone series compounds such as 4,4'-bis(diethylamino) benzophenone particularly is preferred.

The amount of the radiation-sensitive initiators [C] used in the present invention is generally 0.02–60 parts by weight, preferably 0.5–30 parts by weight, based on 100 parts by weight of the polymerizable compound [B].

The radiation-sensitive resin composition for LCD spacer of the present invention comprises the above components [A]–[C] as essential ingredients and other additives as the case may be, and is generally prepared as a liquid composition by adding a solvent to make it in a solution form having proper flow property and viscosity. When the solvent is not properly selected, the aging stability of radiation-sensitive resin composition is poor.

Solvents [D]

Solvent used in the present invention are capable of completely dissolving or dispersing the above components constituting the radiation sensitive compositions, does not react with these components and exhibits appropriate volatility. Therefore, the boiling point of solvent which is lower than 150° C. are typically used. Examples of these solvents include aromatic hydrocarbons such as benzene, toluene and xylene; alcohols such as methanol and ethanol; ethers such as ethylene glycol monopropyl ether, diethylene glycol dimethyl ether, tetrahydrofuran, ethylene glycol monomethyl ether, ethylene glycol monoethyl ether, diethylene glycol monomethyl ether, diethylene glycol monoethyl ether, diethylene glycol monobutyl ether; esters such as methyl cellosolve acetate, ethyl cellosolve acetate, propylene glycol methyl ether acetate, propylene glycol ethyl ether acetate, propylene glycol propyl ether acetate; ketones such as methyl ethyl ketone, acetone. Among these, diethylene glycol dimethyl ether and propylene glycol methyl ether acetate are preferred. These solvents can be used alone or in admixture two or more.

The amount of solvent [D] used in the present invention generally is 50–4,000 parts by weight, preferably 150–3,000 parts by weight, based on 100 parts by weight of copolymer [A].

For the radiation-sensitive resin composition used for LCD spacer according to the present invention, the residual unsaturated carboxylic acid monomer in the radiation-sensitive resin composition is less than 8,000 ppm, preferably less than 6,000 ppm, most preferably less than 3,000 ppm, when the residual unsaturated carboxylic acid monomer is less than 8,000 ppm, the LCD spacer has better surface smoothness and undercutless formed after development.

Surfactant can be used in the present invention to improve the coating property. Examples of the surfactants used for a radiation-sensitive resin composition can be exemplified as follow: polyoxyethylene alkyl ethers such as polyoxyethylene lauryl ether, polyoxyethylene stearyl ether, polyoxyethylene oleyl ether, and the like; polyoxyethylene aryl ethers such as polyoxyethylene octyl phenyl ether, polyoxyehtylene nonyl phenyl ether; polyethylene glycol dialkyl esters such as polyethylene glycol dilaurate, polyethylene glycol distearate, and the like; sorbitan fatty acid esters; fatty acid modified polyesters; tertiary amine modified polyurethans. The following examples can be used as such a surfactants: organosiloxane polymer, KP341 (manufactured by Shin-Etsu Chemical Industry Co., Ltd.), (meth)acrylic acid polymer, Polyflow No. 75, No. 90, No. 95 (manufactured by Kyoei-Sha Yushi Kagaku Kogyo Co., Ltd.), Megafac F171, F172, F173 (manufactured by Dainippon Chemicals and Ink Co., Ltd.), Florard FC430, FC431 (manufactured by Sumitomo 3M Co., Ltd.), and Asahi Gard G710, Serflon S382, SC-101, SC-102, SC-103, SC-104, SC-105, SC-1068 (manufactured by Asahi Glass Co., Ltd.), and the like. The surfactants can be used alone or in admixture two or more. The amount of the above-mentioned surfactant used is generally less than 6 parts by weight, preferably less than 3 parts by weight based on 100 parts by weight of copolymer [A].

The radiation sensitive composition of the present invention can contain other additives such as fillers, polymers other than copolymer [A] according to the present invention, adhesion agent, antioxidant, UV absorbent, anti-coagulant, and the like to improve the property of the radiation-sensitive resin composition.

Examples of these additives can be exemplified as follow: fillers such as glass, alumina; polymers other than the copolymer [A] such as polyvinyl alcohol, polyacrylic acid, polyethylene glycol monoalkyl ether, polyfluoro alkylacrylate, and the like; adhesion agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxy-silane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxy-silane, 3-chloropropylmethyldimethoxysilane, 3-chloropropyltrimethoxysilane, 3-methacryloxypropyltrimethoxysilane, 3-mercaptopropyltrimethoxysilane, and the like; antioxidants such as 2,2-thiobis(4-methyl-6-t-butylphenol), 2,6-di-t-butylphenol, and the like; UV absorbents such as 2-(3-t-butyl-5-methyl-2-hydroxyphenyl)-5-chlorobenzotriazole, alkoxybenzophenone, and the like; and anti-coagulant such as sodium polyacrylic acid.

The radiation-sensitive resin composition for LCD spacer according to the present invention is formed by blending the above-mentioned components [A]-[D] in a mixer to obtain a solution, which is then coated on a substrate. Examples of coating process include spin coating, slit spinning coating and rolling coating. The coated substrate is prebaked to evaporate the solvent. The prebake conditions is depended on the kind and ratio of each component of the radiation-sensitive resin composition, which temperature is on a range from 70° C. to 90° C. with residence time of from 1 minute to 15 minutes. Then, a coating film is formed on the substrate. Thereafter, the coating film is exposed to radiation through a photomask and developed with an alkali developer solution at 23° C.±2° C. for about 30 seconds to 5 minutes to dissolve and remove the unexposed portions of the coating film, so as to give a desired pattern. The radiation used for this purpose is g line, h line and I line of UV light. The UV lamp is (super) high pressure mercury lamp and metal halide lamp.

The substrate used to form the LCD is made from bare glass, soda glass, pyres glass, silica glass, and these glass coated with a transparent conductive film, or transparent electrode substrate used in solid state image pick up device. A black matrix is formed on the substrate to separate each pixel elements.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diaza-bicyclo(5,4,0)-7-undecene, and the like. The concentration of alkali developer is 0.001 wt %–10 wt %, preferably 0.01 wt %–1 wt %. After developed with the developer solution, the resulted pattern is sufficiently washed with water and dried with compressed air or compressed nitrogen, and finally subjected to thermal treatment with a heat device such as a hot plate or an oven at 150° C.–250° C. for 5–60 minutes (on hot plate) or for 30–90 minutes (in oven).

The present invention will be further illustrated by the following examples.

SYNTHESIS EXAMPLES OF COPOLYMER [A]]

Synthesis Example a

A 1000 ml four-necked conical flask equipped which contains a stirrer, a heater, a condenser, and a thermometer is purged with a nitrogen inlet. Then a mixture of monomers comprising 45 g of methacrylic acid monomer, 37.5 g of glycidyl methacrylate monomer, 37.5 g of t-butyl methacrylate monomer, 26 g of styrene monomer and 320 g of diglyme as a solvent, which correspond to the feed composition shown in Table 1, is charged to the flask equipped, wherein the monomer mixture is charged in one shot. The mixture in the conical flask is stirred and the temperature of the oil bath is raised to 86° C. Then a solution of 4 g of 2,2'-azobis-2-methylbutyronitrile (hereinafter abbreviated as AMBN) and 30 g of diethylene glycol dimethyl ether (diglyme), which the content of AMBN is 0.8 wt % of the feed shown in Table 1, is divided into 5 parts and is charged into the four-necked conical flask in an interval of one hour, respectively. During the polymerization, the reaction temperature is maintained at 70° C., and the polymerization time is 6 hours. After polymerization, the polymerization product is withdrawn from the conical flask and resin solution is obtained.

By removing the solvent from the above resin solution, the resin solution a can be prepared and the solid content is 30%. The molecular weight distribution of the resin solution a is analyzed by gel permeation chromatography. The results are shown in Table 1.

Synthesis Examples b–c

The procedure of Synthesis Example a is repeated, except that the kind and dosage of the initiator are changed. The formulation and the molecular weight distribution of the resin solution b, c are shown in Table 1.

Synthesis Example d

The procedure of Synthesis Example a is repeated, except that the monomer mixture is fed into the four-necked flask in a continuous mode and the kind of copolymerizable unsaturated monomer (a3) is changed. The formulation and the molecular weight distribution of the resin solution d are shown in Table 1.

Synthesis Example e

The procedure of Synthesis Example d is repeated, except that the reaction temperature is 55° C. The formulation and the molecular weight distribution of the resin solution e are shown in Table 1.

Synthesis Example f

The procedure of Synthesis Example a is repeated, except that the kind and dosage of the initiator are changed. The reaction temperature is 60° C. and the polymerization time is 5.5 hours. The formulation and the molecular weight distribution of the resin solution f are shown in Table 1.

Synthesis Example g

The procedure of Synthesis Example a is repeated, except that the dosage of the initiator is changed. The feed mode for the initiator is changed to be charged in one shot. The reaction temperature is increased from 65° C. up to 80° C. during polymerization, and the polymerization time is 5.5 hours. The formulation and the molecular weight distribution of the resin solution g are shown in Table 1.

Synthesis Example h

The procedure of Synthesis Example a is repeated, except that the kind and dosage of the initiator are changed, wherein all of the initiator AMBN is added at the start polymerization and all of the initiator 2,2'azobis-(2,4-dimethyl valeronitrile) (hereafter abbreviated as ADVN) is added at the time 2 hrs after the start of polymerization. The polymerization time is 5 hours. The formulation and the molecular weight distribution of the resin solution h are shown in Table 1.

Synthesis Examples i–j

The procedure of Synthesis Example a is repeated, except that the monomer ratio (a1/a2/a3) is changed. The formulation and the molecular weight distribution of the resin solution i–j are shown in Table 1.

Synthesis Examples k–m

The procedure of Synthesis Example d is repeated, except that the monomer ratio (a1/a2/a3) is changed. The formulation and the molecular weight distribution of the resin solution k–m are shown in Table 1.

Examples 1–5 and Comparative Examples 1–8

Radiation-sensitive resin compositions are prepared by using the resin solutions obtained in the above-mentioned Synthesis Examples according to the formulation shown in Table 2. The residual carboxylic acid monomer in each radiation-sensitive resin composition is analyzed by gas chromatography analysis and the data are shown in Table 2.

The radiation-sensitive resin composition is mixed by an agitator, and then applied to the surface of a glass substrate by spin coating to obtain a film with a thickness of about 2 $\mu$m. The resulting substrate is prebaked at 85° C. for 5 minutes. Thereafter the substrate is exposed to UV light (exposure machine Cannon PLA-501F) with a dosage of 300 mJ/cm$^2$ through a photomask. This substrate is then immersed in a developer solution at 23° C. for 2 minutes, washed with pure water and dried. Thereafter, the substrate is post-baked at 200° C. for 40 minutes to produce the spacers on glass substrate.

The resultant spacers are evaluated by the following methods for the developing property, undercut, surface smoothness, heat resistance and chemical resistance.

Evaluation Modes

1. Aging stability: The radiation-sensitive resin compositions are placed for one week to observe the change of viscosity.
   O: The viscosity is about the same or is increased little
   X: The viscosity is increased largely and gelation is occurred
2. Developing property: To inspect whether the pattern is perfect or not after developing.
   O: The pattern is perfect and the boundary is smooth
   Δ: The pattern is not perfect, which boundary is not smooth
   X: The pattern is not perfect, and some of the pattern are peel off
3. Undercut: The edge of pattern is observed for undercut by SEM.
   O: No undercut
   Δ: Undercut is occurred
4. Surface smoothness: The surface variation is scanned by surface profiler Tencor α-step 500 and evaluated according to the following criteria:
   O: Variation of surface smoothness ≦20 Å
   Δ: Variation of surface smoothness 20 Å-50 Å
   X: Variation of surface smoothness >50 Å
5. Heat resistance: The thickness of the resultant spacers on the glass substrate is measured for its thickness by surface profiler Tencor α-step 500 before and after heat treatment which condition is 250° C. for 60 minutes. Evaluation is made based on the thickness change before and after heat treatment.
   O: Thickness change≦1%
   Δ: Thickness change 1%–3%
   X: Thickness change>3%
6. Chemical resistance: The thickness of the resultant spacer on the glass substrate is measured by surface profiler Tencor α-step 500 before and after chemical treatment. The chemical treatment is to immerse the glass substrate in N-methyl pyrrolidinone (NMP) at 23° C.±2° C. for 30 minutes and baked at 120° C. for 30 minutes. Evaluation is made based on the thickness changes before and after the chemical treatment.
   O: Thickness change≦1%
   Δ: Thickness change 1%–3%
   X: Thickness change>3%
7. Determination of the molecular weight distribution: This Mw is determined by the instrument of gel permeation chromatography which is made by Waters company.
   column: KD-806M
   detector: Waters RI 2410
   mobile phase: THF (flow rate: 1.0 ml/min)
   Polystyrene of standard molecular weight is used as the determination standard.
   In the scope of the GPC determination, the total integral area of the intensity of copolymer [A] between 800–2,000,000 is taken as 100 wt %. On this basis, the content of the resin which has a molecular weight of 800–7,000 and the content of the resin which has a molecular weight of greater than 70,000 are determined.
8. Determination of the residual methacrylic acid monomer:
   The radiation-sensitive resin composition is dissolved in TBff. The resultant solution is analyzed by gas chromatography (Hewlett Packard 5890, equipped with a flame ionization detector). The results are expressed in ppm based on 100 wt % of the radiation-sensitive resin composition.
   The evaluation results are shown in Table 3.

It is apparent to those skill in the art that the foregoing descriptions are merely the preferred embodiments and examples. The scope of the present invention is not to be limited by the specific embodiments and examples herein disclosed. Any equivalent variations or modifications, which are performed within the spirit disclosed by the present invention, are intended to fall within the scope of this invention.

TABLE 1

| Synthesis Examples for copolymer [A] | | | | | | | |
|---|---|---|---|---|---|---|---|
| Co- | Feed composition (wt %) | | | | | | |
| polymer [A] | Monomer (a1) | Monomer (a2) | Monomer (a3) | | | Initiator | Solvent |
| soln. | MAA | GMA | TBMA | DCPMA | ST | AMBN  ADVN | Diglyme |

TABLE 1-continued

Synthesis Examples for copolymer [A]

| | | | | | | | | |
|---|---|---|---|---|---|---|---|---|
| a | 9 | 7.5 | 7.5 | — | 5.2 | 0.8 | — | 70 |
| b | 9 | 7.5 | 7.5 | — | 5.2 | 0.7 | — | 70 |
| c | 9 | 7.5 | 7.5 | — | 5.2 | — | 0.9 | 70 |
| d | 9 | 7.5 | — | 7.5 | 5.2 | 0.8 | — | 70 |
| e | 9 | 7.5 | 7.5 | — | 5.2 | 0.8 | — | 70 |
| f | 9 | 7.5 | 7.5 | — | 5.2 | — | 0.3 | 70 |
| g | 9 | 7.5 | 7.5 | — | 5.2 | 1.2 | — | 70 |
| h | 9 | 7.5 | 7.5 | — | 5.2 | 0.2 | 0.2 | 70 |
| i | 1.2 | 8 | 8 | — | 14 | 0.8 | — | 70 |
| j | 24 | 2.6 | 2.6 | — | — | 0.8 | — | 70 |
| k | 9 | 1.5 | 12 | — | 6.7 | 0.8 | — | 70 |
| l | 4.5 | 22.5 | 1.5 | — | 0.7 | 0.8 | — | 70 |
| m | 2 | 6.5 | 2 | — | 18.7 | 0.8 | — | 70 |

| Co-polymer [A] soln. | (a1)/(a2)/(a3) | Monomer feed mode | Reaction temp. (° C.) | Polymerization time (h) | Molecular weight distribution 800–7,000 (%) | 7,000–70,000 (%) | >70,000 (%) |
|---|---|---|---|---|---|---|---|
| a | 30.8/25.7/43.5 | Add in one shot | 70 | 6 | 15 | 83 | 2 |
| b | ↑ | ↑ | 70 | 6 | 12 | 84 | 4 |
| c | ↑ | ↑ | 70 | 6 | 18 | 81 | 1 |
| d | ↑ | Add continuously | 70 | 6 | 17 | 81 | 2 |
| e | ↑ | ↑ | 55 | 6 | 13 | 83 | 4 |
| f | ↑ | Add in one shot | 60 | 5.5 | 8 | 84 | 8 |
| g | ↑ | ↑ | 65→80 | 5.5 | 30 | 68 | 2 |
| h | ↑ | ↑ | 70 | 5 | 12 | 82 | 10 |
| i | 3.8/25.6/70.6 | ↑ | 70 | 6 | 12 | 83 | 5 |
| j | 82.2/8.9/8.9 | ↑ | 70 | 6 | 20 | 79 | 1 |
| k | 30.8/5.1/64.0 | Add continuously | 70 | 6 | 11 | 85 | 4 |
| l | 15.4/77.1/7.5 | ↑ | 70 | 6 | 15 | 83 | 2 |
| m | 6.8/22.2/70.9 | ↑ | 70 | 6 | 8 | 86 | 6 |

MAA: methacrylic acid
GMA: glycidyl methacrylate
TBMA: t-butyl methacrylate
DCPMA: dicyclopnetanyl methacrylate
ST: styrene
AMBN: 2,2'-azobis-2-methyl butyronitrile
ADVN: 2,2'-azobis-(2,4-dimethyl valeronitrile)
Diglyme: diethyleneglycol dimethyl ether

TABLE 2

| composition | Example No. | | | | | Comparative example No. | | | | | | | |
|---|---|---|---|---|---|---|---|---|---|---|---|---|---|
| | 1 | 2 | 3 | 4 | 5 | 1 | 2 | 3 | 4 | 5 | 6 | 7 | 8 |
| Copolymer [A] Solution | | | | | | | | | | | | | |
| a | 4.2 | | | | | | | | | | | | |
| b | | 4.2 | | | | | | | | | | | |
| c | | | 4.2 | | | | | | | | | | |
| d | | | | 4.2 | | | | | | | | | |
| e | | | | | 4.2 | | | | | | | | |
| f | | | | | | 4.2 | | | | | | | |
| g | | | | | | | 4.2 | | | | | | |
| h | | | | | | | | 4.2 | | | | | |
| i | | | | | | | | | 4.2 | | | | |
| j | | | | | | | | | | 4.2 | | | |
| k | | | | | | | | | | | 4.2 | | |
| l | | | | | | | | | | | | 4.2 | |
| m | | | | | | | | | | | | | 4.2 |
| [B] | | | | | | | | | | | | | |
| DPHA | 1.2 | 1.2 | 1.2 | 1.2 | 1.2 | 1.2 | 1.2 | 1.2 | 1.2 | 1.2 | 1.2 | 1.2 | 1.2 |
| [C] | | | | | | | | | | | | | |
| C-1 | 0.14 | 0.14 | 0.14 | 0.14 | 0.14 | 0.14 | 0.14 | 0.14 | 0.14 | 0.14 | 0.14 | 0.14 | 0.14 |

TABLE 2-continued

| composition | Example No. | | | | | Comparative example No. | | | | | | | |
|---|---|---|---|---|---|---|---|---|---|---|---|---|---|
| | 1 | 2 | 3 | 4 | 5 | 1 | 2 | 3 | 4 | 5 | 6 | 7 | 8 |
| C-2 | 0.04 | 0.04 | 0.04 | 0.04 | 0.04 | 0.04 | 0.04 | 0.04 | 0.04 | 0.04 | 0.04 | 0.04 | 0.04 |
| C-3 | 0.02 | 0.02 | 0.02 | 0.02 | 0.02 | 0.02 | 0.02 | 0.02 | 0.02 | 0.02 | 0.02 | 0.02 | 0.02 |
| [D] | | | | | | | | | | | | | |
| Diglyme | 8.94 | 8.94 | 8.94 | 8.94 | 8.94 | 8.94 | 8.94 | 8.94 | 8.94 | 8.94 | 8.94 | 8.94 | 8.94 |
| [MAA]r | 2104 | 2523 | 1962 | 6321 | 10512 | 9283 | 5237 | 5869 | 512 | 6522 | 2452 | 1266 | 1362 |

(1) All of the data of [A]–[D] are expressed as parts by weight.
(2) Solid content of all of the copolymers [A] are 30%. Therefore, the amount of solid in 4.2 grams of copolymer [A] solution is 1.26 grams
(3) DPHA: dipentaerythritol hexaacrylate
C-1: 2-benzyl-2-N,N-dimethylamino-1-(4-morpholinophenyl)-1-butanone
C-2: 4,4'-bis(diethylamino)benzophenone
C-3: 2,2'-bis(2-chlorophenyl)-4,4',5,5'-tetraphenylbiimidazole
Diglyme: diethyleneglycol dimethyl ether
[MAA]r: content of residual monomer of methacrylic acid (in ppm), based on 100 wt % of radiation-sensitive resin composition.

TABLE 3

| | Aging stability | Surface smoothness | undercut | Developing property | Heat resistance | Chemical resistance |
|---|---|---|---|---|---|---|
| Example | | | | | | |
| 1 | ○ | ○ | ○ | ○ | ○ | ○ |
| 2 | ○ | ○ | ○ | ○ | ○ | ○ |
| 3 | ○ | ○ | ○ | ○ | ○ | ○ |
| 4 | ○ | ○ | ○ | ○ | ○ | ○ |
| 5 | ○ | Δ | Δ | ○ | ○ | ○ |
| Comparative example | | | | | | |
| 1 | X | Δ | Δ | X | ○ | ○ |
| 2 | ○ | ○ | ○ | Δ | X | X |
| 3 | X | ○ | ○ | X | ○ | ○ |
| 4 | ○ | ○ | ○ | X | ○ | ○ |
| 5 | ○ | ○ | ○ | X | Δ | Δ |
| 6 | ○ | ○ | ○ | X | X | X |
| 7 | ○ | ○ | ○ | X | ○ | ○ |
| 8 | ○ | ○ | ○ | X | ○ | ○ |

What is claimed is:

1. A radiation-sensitive resin composition for LCD spacer, comprising:
[A] a copolymer of (a1) 5 wt %–50 wt % of unsaturated carboxylic acid monomer derivative unit; (a2) 10 wt %–70 wt % of epoxy-containing unsaturated monomer derivative unit; and (a3) 0 wt %–70 wt % of copolymerizable unsaturated monomer derivative unit other than the above monomer derivative units (a1) and (a2);
[B] a polymerizable compound having at least one ethylenically unsaturated double bonds;
[C] a radiation-sensitive polymerization initiator; and
[D] a solvent;
wherein the content of said copolymer [A] which has a molecular weight of 800–7,000 and the content of said copolymer [A] which has a molecular weight of greater than 70,000 are determined to account for 10 wt %–23 wt % and less than 5 wt %, respectively, based on the total weight of said copolymer[A].

2. A radiation-sensitive resin composition for LCD spacer according with claim 1, wherein the residual unsaturated carboxylic acid monomer in said radiation-sensitive resin composition is less than 8,000 ppm.

3. A radiation-sensitive resin composition for LCD spacer according with claim 1, wherein the residual unsaturated carboxylic acid monomer in said radiation-sensitive resin composition is less than 6,000 ppm.

4. A radiation-sensitive resin composition for LCD spacer according with claim 1, wherein the amount of copolymerizable unsaturated monomer derivative unit (a3) is 10–60 wt %.

* * * * *